(12) United States Patent
Ho et al.

(10) Patent No.: US 7,323,732 B2
(45) Date of Patent: Jan. 29, 2008

(54) MRAM ARRAY EMPLOYING SPIN-FILTERING ELEMENT CONNECTED BY SPIN-HOLD ELEMENT TO MRAM CELL STRUCTURE FOR ENHANCED MAGNETORESISTANCE

(75) Inventors: ChiaHua Ho, Kaoshing (TW); Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 253 days.

(21) Appl. No.: 10/791,911

(22) Filed: Mar. 3, 2004

(65) Prior Publication Data

US 2005/0195646 A1 Sep. 8, 2005

(51) Int. Cl.
*H01L 29/76* (2006.01)
(52) U.S. Cl. .................. 257/295; 257/421; 257/422
(58) Field of Classification Search ............ 257/295, 257/421, 422
See application file for complete search history.

(56) References Cited

U.S. PATENT DOCUMENTS

| 5,792,569 A | 8/1998 | Sun et al. |
| 5,801,984 A | 9/1998 | Parkin |

OTHER PUBLICATIONS

Moon-Ho Jo et al., "Very Large Magnetoresistance and Coherent Switching in Half-Metallic Manganite Tunnel Junctions," The American Physical Society, vol. 61, No. 22:R14 905-R14 908 (Jun. 1, 2000).

*Primary Examiner*—Douglas M. Menz
(74) *Attorney, Agent, or Firm*—Bill Kennedy; Haynes Beffel & Wolfeld LLP (57) ABSTRACT

An MRAM array having enhanced magnetoresistance includes a spin filtering element connected by a spin hold element to the MRAM cell structures. A spin filtering element may serve several MRAM cell structures, by connecting the spin filtering element to a series of MRAM cell structures by a spin hold wire, or a spin filtering element and a spin hold element may be formed as adjacent layers in each MRAM cell stack.

95 Claims, 5 Drawing Sheets

MRAM ARRAY EMPLOYING SPIN-FILTERING ELEMENT CONNECTED BY SPIN-HOLD ELEMENT TO MRAM CELL STRUCTURE FOR ENHANCED MAGNETORESISTANCE

BACKGROUND

This invention relates to magnetoresistive thin films and to devices having magnetoresistive elements for magnetic data storage, particularly in magnetic random access memory arrays.

Sun et al. U.S. Pat. No. 5,792,569 describes a tri-layer thin film magnetoresistive device having doped perovskite manganate thin films as ferromagnetic elements, separated by a barrier layer.

Parkin U.S. Pat. No. 5,801,984 describes a magnetic tunnel junction device, including a high coercivity fixed ferromagnetic multilayer structure and a single free ferromagnetic layer, separated by an insulating tunnel barrier layer. The fixed ferromagnetic multilayer is made up of two layers, a first ferromagnetic layer with a coercivity substantially higher than the applied field, and a thin ferromagnetic interface layer located between and in contact with the insulating tunnel barrier layer. The material of the first ferromagnetic layer of the multilayer can have low magnetization and thus poor spin filtering, and the interface layer is said to provide spin filtering.

MRAM constructs are needed, which are manufacturable and which have enhanced magnetoresistance, that is, which enhance the signal difference between the 0 and 1 states of the cell.

SUMMARY

According to the invention, enhanced magnetoresistance (tunneling magnetoresistance (TMR) in a MTJ cell structure; giant magnetoresistance (GMR) in a GMR cell structure) is provided by interposing a spin filtering element in the circuit in front of the MRAM cell structure, and connecting the spin filtering element with the MRAM structure by a spin hold element. A spin filtering element may serve several MRAM cell structures, by connecting the spin filtering element to a series of MRAM cell structures by a spin hold wire. Or, a spin filtering element and the spin hold element may be formed as adjacent layers in each MRAM cell stack.

In one general aspect the invention features a MRAM construct including a MRAM (GMR or MTJ) cell structure having at least two ferromagnetic layers separated by a conductor layer (GMR) or an insulator layer (MTJ), and including a spin hold layer adjacent a first one of the two ferromagnetic layers, and a spin filtering layer adjacent the spin hold layer.

In another general aspect the invention features a MRAM array made up of a plurality such MRAM structures.

In some embodiments the spin filtering element includes a ferromagnetic material having a high magnetic polarization value, including for example a Mn-based CMR material such as, for example, $La_xSr_{1-x}MnO_3$ or $Pr_xCa_{1-x}MnO_3$, or a Mn-based ferromagnetic material such as, for example, NiMnSb, or other material such as, for example, $Fe_3O_4$, $CrO_2$.

In some embodiments the spin hold element (layer or wire) is Bi. In other embodiments, where the spin hold element and the spin filtering element are adjacent layers in the MRAM stack, the spin hold layer can be a thin layer of a conductive metal, in which the thickness of the spin hold layer is less than the electron mean free path in the metal. Such embodiments include, for example, a layer of Cu having a thickness in the range about 4 nm to about 10 nm, or a layer of Al having a thickness in the range about 4 nm to about 5 nm.

In some embodiments the MRAM cell structure includes a MTJ system having two ferromagnet layers separated by a thin insulator, such as $Al_2O_3$. The ferromagnet layers have different coercivity fields; in some embodiments the MRAM cell structure includes a spin-valve MTJ, having for example a free ferromagnetic layer and a ferromagnetic layer pinned by a pinning layer such as an antiferromagnetic (AFM) layer, such as IrMn, or FeMn or CoFe/Ru/CoFe; in other embodiments the MRAM cell structure includes a "pseudo-spin-valve MTJ", having for example a soft ferromagnet layer and a hard ferromagnet layer. Here, "soft" and "hard" ferromagnets have coercivity fields respectively smaller (soft ferromagnet) and larger (hard ferromagnet). For example, where CoFe with a coercivity field of 50 Oe is selected as the hard ferromagnet material, then the soft ferromagnet material can be one that has a coercivity field smaller than 50 Oe, such as, for example, NiFe (having a coercivity about 10 Oe) or Co (having a coercivity about 30 Oe) or NiFeCo (having a coercivity about 20 Oe).

In some embodiments the MRAM cell structure includes a granular TMR system having a granular ferromagnetic material. Suitable granular TMR systems have many ferromagnetic grains embedded in an insulating matrix; such granular systems include, for example, $Fe—Al_2O_3$, $Fe—SiO_2$, or $Co—SiO_2$. The grain size and the inter-distance between ferromagnetic grains is in the range about 100 Å to about 300 Å.

In some embodiments the MRAM cell structure includes a GMR system having at least two (first and second) ferromagnetic layers separated by a thin conducting layer such as Cu, Ag, or Ru. The ferromagnet layers have different coercivity fields; in some embodiments the MRAM cell structure includes a spin-valve GMR, having for example a free ferromagnetic layer and a ferromagnetic layer pinned by a pinning layer such as an antiferromagnetic (AFM) layer, for example IrMn or FeMn or CoFe/Ru/CoFe; in other embodiments the MRAM cell structure includes a "pseudo-spin-valve GMR", having for example a soft ferromagnet layer and a hard ferromagnet layer. Here, "soft" and "hard" ferromagnets have coercivity fields respectively smaller (soft ferromagnet) and larger (hard ferromagnet). For example, where CoFe with a coercivity field of 50 Oe is selected as the hard ferromagnet material, then the soft ferromagnet material can be one that has a coercivity field smaller than 50 Oe, such as, for example, NiFe (having a coercivity about 10 Oe) or Co (having a coercivity about 30 Oe) or NiFeCo (having a coercivity about 20 Oe).

In some embodiments the MRAM cell structure includes a GMR multilayer system having periodic ferromagnetic metal/nonferromagnetic metal layer, with several such periods, such as, for example, n periods of NiFe/Cu multilayer, that is, $(NiFe/Cu)_n$, and the like.

In some embodiments the MRAM cell structure includes a granular GMR system having a granular ferromagnetic material. Suitable granular TMR systems have many ferromagnetic grains embedded in a nonmagnetic insulating matrix; such granular structures include, for example, $Fe—Al_2O_3$, $Fe—SiO_2$, or $Co—SiO_2$. The grain size and the inter-distance between ferromagnetic grains is in the range about 100 Å to about 300 Å.

In another general aspect the invention features a MRAM construct including a plurality of MRAM (GMR or MTJ) cell structures each having at least two ferromagnetic layers separated by a conductor layer (GMR) or an insulator layer (MTJ), and including a spin filtering element connected to the several MRAM cell structures by a spin hold line adjacent a first one of the two ferromagnetic layers on the MRAM cell structures.

In another general aspect the invention features a MRAM array made up of such connected MRAM structures.

The invention provides for a TMR ratio that can exceed 100% in MTJ structures having no defect, or having low defect; and the invention provides TMR ratios in MTJ that are higher than without the spin filtering element. The invention also provides for an enhanced GMR ratio in GMR structures.

In another general aspect the invention features a method for making a MRAM construct having a plurality of MRAM (GMR or MTJ) cell structures connected to a spin filtering element by a spin hold element. In some embodiments, in which forming the spin filtering element requires a high temperature anneal, the spin filtering element is formed prior to forming the MRAM cell structure, so that the high temperature anneal cannot adversely affect the MRAM cell structure. In other embodiments in which forming the spin filtering element requires a high temperature anneal, the high temperature anneal is carried out using pulsed laser energy, in which the pulse lengths and energy fluence are selected so that features adjacent the spin filtering element are not heated excessively during the anneal; in these embodiments the spin filtering element may be formed either prior to or following formation of the MRAM cell structure.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGS. illustrating embodiments of the invention, elements corresponding to elements shown in other drawings are not all particularly renumbered, although they are all readily identifiable in all the FIGS.

Figure 1:
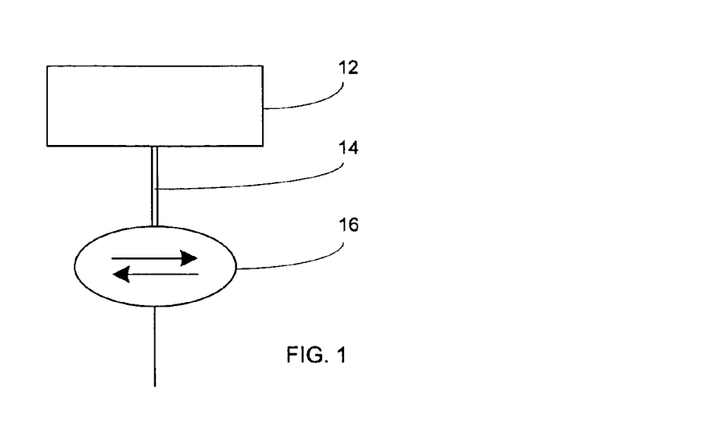
FIG. 1 is a diagram illustrating a first aspect of the invention.

Turning now to the drawings, FIG. 1 illustrates diagrammatically the general arrangement of parts in a device according to a first aspect of the invention. Particularly, a spin filter 12 is in this aspect connected by way of a spin hold wire 14 to a magnetic random access memory (MRAM) cell 16.

The spin filter 12 is formed of a conductive ferromagnetic material having a high magnetic polarization value (P) and, accordingly it may be formed of materials that have magnetic polarization values that are high (P>50%) and ultra-high (P~90%). These materials include transition materials having high magnetic polarization values, such as for example $Co_xFe_{1-x}$ alloys (P~55%) or $Co_xFe_{1-x}B_y$ alloys (P~60%), and semi-metallic ferromagnetic materials (or Heusler alloys) having ultra-high magnetic polarization values (P>90%), such as $Fe_3O_4$, $CrO_2$ or $La_xSr_{1-x}MnO_3$ (LMSO) or $Pr_xCa_{1-x}MnO_3$ or $NiMnSb$. The magnetization of these spin filter materials must be parallel or antiparallel t that of the reference layer of the MTJ or GMR cell in order to degrade the destruction of electron polarization from misaligned magnetization. Because these spin filter materials have magnetic properties similar to the MRAM cell, except for the spin polarization (P) value, the scalability is similar to that of the MRAM cell. For the in-plane magnetization design (the traditional MRAM design) the scalability can reach in the order of several times 10 nm. For the out-of-plane design (perpendicular magnetization of the MRAM cell), the scalability can reach in the order of several nm. The current flow in the spin filter material cannot affect the performance of the spin filtering, due to the definition of magnetization alignment between the spin filter material and the MRAM cell.

Other suitable materials for the spin filter include: manganese-based GMR materials such as, for example, NiMnGa or NiMnSb; manganese-based ferromagnetic materials such as, for example, $La_xSr_{1-x}MnO_3$ or $Pr_xCa_{1-x}MnO_3$; or other materials such as, for example, $Fe_3O_4$ or $CrO_2$.

MRAM cell 16 includes a magnetic tunnel junction (MTJ) structure. The spin hold wire or spacer is constructed of a material that has a long spin diffusion length, such as bismuth, which may be in a single-crystal form (monocrystalline Bi) or a poly-crystal form (polycrystalline Bi).

Figure 4A:
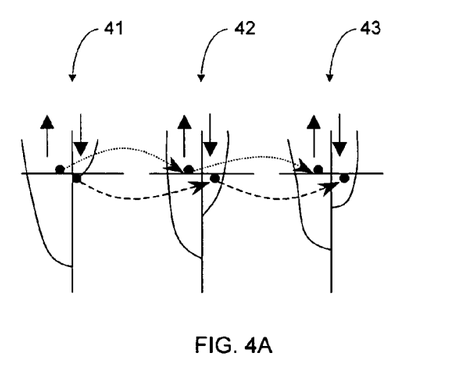
FIGS. 4A, 4B are diagrams illustrating spin configuration of a magnetic tunnel junction device with a spin filtering device according to an aspect of the invention, in the parallel state (FIG. 4A) and in the antiparallel state (FIG. 4B).
Figure 4B:
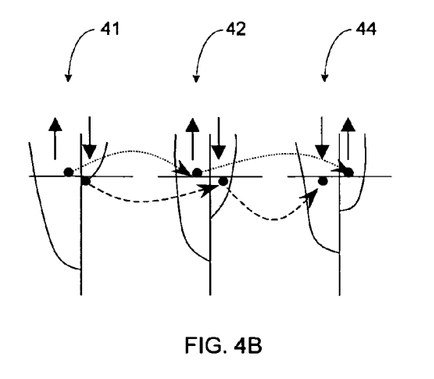

Employing the spin filtering element significantly improves the tunneling magnetoresistance in the MTJ cell. The extent of the improvement can be identified, with reference to FIGS. 4A, 4B, as follows. FIG. 4A diagrammatically illustrates the spin states of the spin filter 41, and the first ferromagnet 42 and the second ferromagnet 43 of the TMR device where the MTJ is in a parallel magnetic state; and FIG. 4B diagrammatically illustrates the spin states of the spin filter 41, and the first ferromagnet 42 and the second ferromagnet 44 of the TMR device where the MTJ is in an antiparallel magnetic state.

Let the polarization values of the spin-filtering element, the first ferromagnet, and the second ferromagnet be $P_1$, $P_2$, and $P_3$, respectively. If the MTJ is in the parallel magnetic state (FIG. 4A), the tunneling current $I_P$ with spin-conservation is:

$$I_P \propto (1+p_1)(1+p_2)(1+p_3)+(1-p_1)(1-p_2)(1-p_3).$$

If the MTJ is in the antiparallel magnetic state (FIG. 4B), the spin configuration of the majority or minority band of the second ferromagnet 44 is opposite that of the first ferromagnet 42. Here the ideal tunneling current $I_{AP}$ with spin-conservation is:

$$I_{AP} \propto (1+p_1)(1+p_2)(1-p_3)+(1-p_1)(1-p_2)(1+p_3).$$

The tunneling magnetoresistance TMR is:

$$TMR = \frac{2(p_1 p_3 + p_2 p_3)}{1 + p_1 p_2 - p_1 p_3 - p_2 p_3} \times 100\%.$$

For example, where the magnetic polarization values of the first and second ferromagnets are $P_2=50\%$ and $P_3=50\%$, the TMR ratio is 66% without the use of a spin filter. If, on the other hand, a spin filter is employed according to the invention, and if the spin filter is formed of $CrO_2$ ($P_1=90\%$), the maximum TMR ratio can reach 187%, which is much larger than that without spin filter. Here, the values of $P_1$, $P_2$, and $P_3$ are higher; the TMR ratio of MTJ is higher.

In practice, there may be defects at the MTJ interfaces, introducing scattering. To account for defects, a scattering factor f may be introduced into the equations for $I_P$ and $I_{AP}$. The parallel state tunneling current with inelastic tunneling is expressed as:

$$I_P \propto [(1+p_1)(1+p_2)(1+p_3)+(1-p_1)(1-p_2)(1-p_3)](1-f) + [(1+p_1)(1+p_2)(1-p_3)+(1-p_1)(1-p_2)(1+p_3)](f);$$

and the antiparallel state tunneling current with inelastic tunneling is expressed as:

$$I_P \propto [(1+p_1)(1+p_2)(1+p_3)+(1-p_1)(1-p_2)(1-p_3)](1-f) + [(1+p_1)(1+p_2)(1-p_3)+(1-p_1)(1-p_2)(1+p_3)](f).$$

The TMR ratio for the MTJ having defects at the interfaces is:

$$TMR = \frac{(1-2f)(p_1 p_3 + p_2 p_3)}{1 + (p_1 p_2 - p_1 p_3 - p_2 p_3) + 2f p_1 p_3 + 2f p_2 p_3} \times 100\%.$$

For example, assuming a large spin-flip scattering factor f=0.3 (TMR=0 for f=0.5), the TMR ratio without a spin filter is 11%. If, on the other hand, a spin filter is employed according to the invention, and if the spin filter is formed of $CrO_2$ ($P_1=90\%$), the maximum TMR ratio can reach 24%, which, while much lower than the ideal case, is significantly larger than that without the spin filter.

The spin filter is constructed in situ, and certain steps of the process for forming the preferred spin filter materials may be incompatible with at least some elements of the MRAM cell. That is, if parts of the MRAM cell are formed before the spin filter, then the MRAM parts must be protected during spin filter construction.

Figure 2:
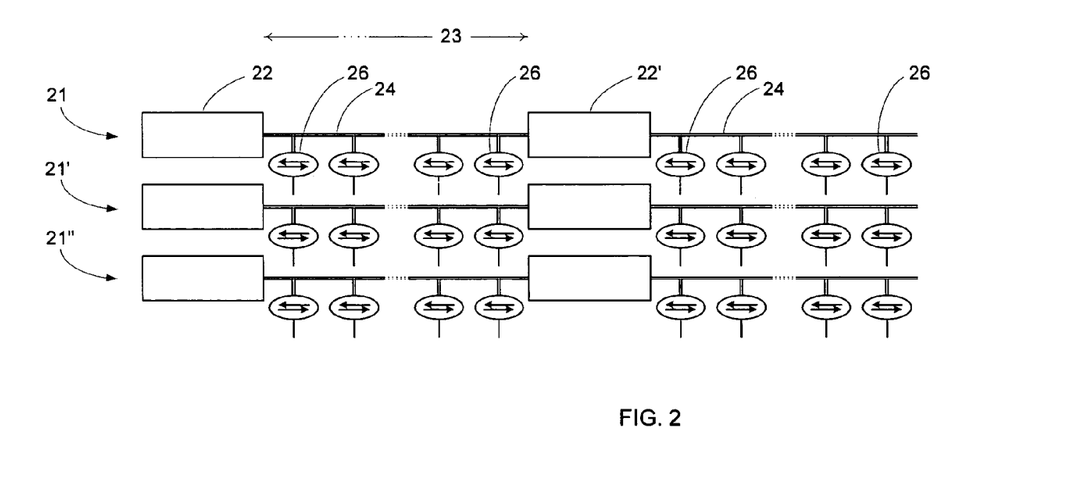
FIG. 2 is a diagram illustrating a part of a memory array, according to an aspect of the invention, made up of elements as diagrammed in FIG. 1.

Referring now to FIG. 2, there is shown a diagram illustrating a part of a memory array, according to an aspect of the invention, made up of elements as diagrammed in FIG. 1. The figure excludes the program circuits. Particularly, the array includes rows 21, 22', 22" of magnetic tunnel junction (MTJ) cells 26 connected by way of a spin hold wire 24 to spin filters 22. The length 23 of spin wire segments between nearest spin filters is determined by the spin-diffusion length of the spin wire, which can reach several µm or more, depending upon its crystalline structure, and the spin hold wire 24 can support several MTJ cells 26 on one segment, having a length 23, in a given row. The fabrication of the spin-filtering element and spin-hold wire can be done before or after the fabrication of MRAM cell.

Figure 3:
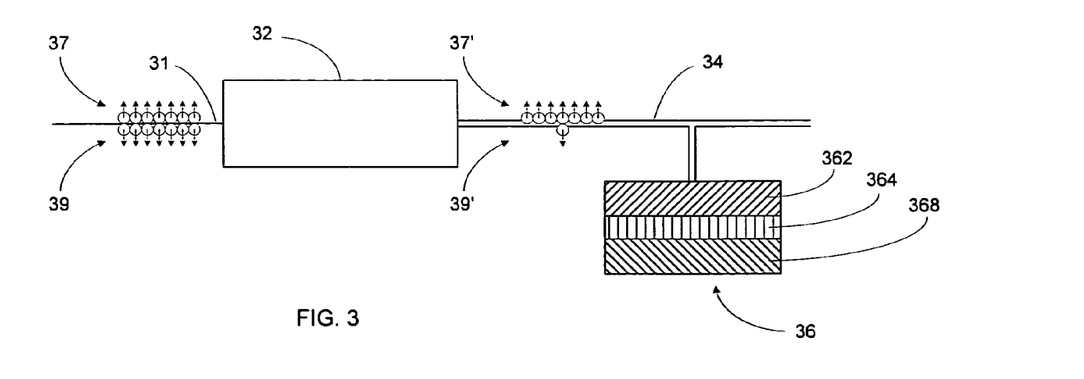
FIG. 3 is a diagram illustrating an aspect of the invention, as in FIG. 1, in further detail.

The operation of the spin filter is illustrated diagrammatically in FIG. 3. The initial electron current in the wire 31 before the current is introduced into the spin filtering element 32 includes spin up 37 and spin down currents 39 are equivalent; that is, there are the same number of spin up electrons as spin down electrons in the initial current. As the current flows through the spin-filtering element, a significant proportion of the spin down electrons can be filtered out. As a result, as the current enters the spin hold wire 34 there is a much greater proportion of spin up electrons 37' than spin down electrons 39'. Hence, the electron spin configuration in the spin hold wire is predominantly (almost exclusively) spin-up. The filtered current is tapped from the spin hold wire and introduced into the MRAM cell 36. Over the length of the spin hold wire, the spin configuration diffuses progressively, so that at some point along the spin hold wire it will be necessary to pass the current through a subsequent spin filter, as illustrated in FIG. 2.

The MRAM cell 36 is a conventional cell; it includes a first ferromagnetic layer 362 and a second ferromagnetic layer 368 separated by a separation layer 364. Where the MRAM cell is a MTJ, the separation layer 364 can be an insulator layer; where the MRAM cell is a GMR cell, the separation layer 364 can be a thin conductive layer. The first ferromagnetic layer and the second ferromagnetic layer can be formed of a 3d transition ferromagnetic metal such as, for example, Fe, Co, NiFe, CoFe, FeCoNi; or an alloy (or a Heusler alloy) such as, for example, $Fe_3O_4$, $CrO_2$, $La_xSr_{1-x}MnO_3$, $Pr_xCa_{1-x}MnO_3$; the insulator layer of the MTJ can be formed of, for example, $Al_2O_3$, AlN, AlON, $Ga_2O_3$, $SrTiO_3$ (STO), $HfO_2$, $Ta_2O_5$, and the conductor layer of the GMR can be formed of, for example, Cu, Ag, Au, Ru, Cr.

Figure 5A:
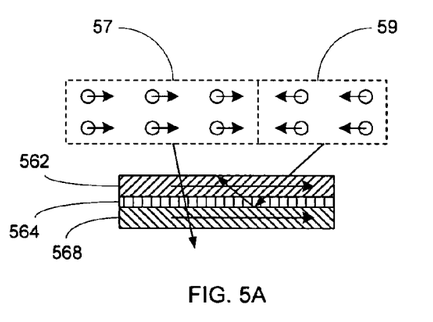
FIGS. 5A, 5B, 5C, 5D are diagrams illustrating spin states of a giant magnetoresistance device: without a spin filtering element, in the parallel state (FIG. 5A) and in the antiparallel state (FIG. 5C); and with a spin filtering element according to a second aspect of the invention, in the parallel state (FIG. 5B) and in the antiparallel state (FIG. 5D).
Figure 5B:
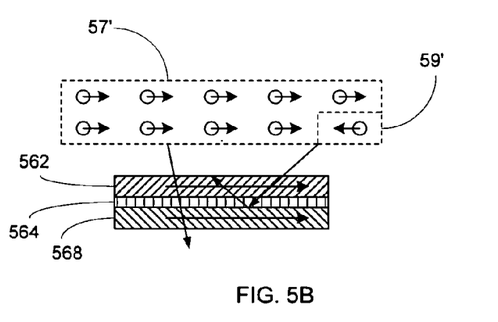
Figure 5C:
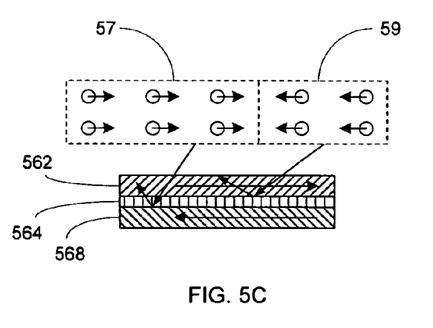
Figure 5D:
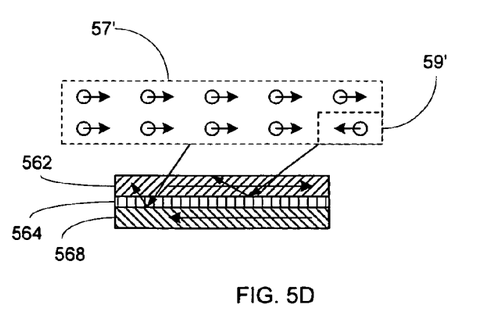

FIGS. 5A, 5B, 5C, 5D are diagrams illustrating spin states of a giant magnetoresistance device: without a spin filtering element, in the parallel state (FIG. 5A) and in the antiparallel state (FIG. 5C); and with a spin filtering element according to a second aspect of the invention, in the parallel state (FIG. 5B) and in the antiparallel state (FIG. 5D). Each giant magnetoresistance (GMR) device is a layered structure includes a first ferromagnet layer 562 and a second ferromagnet layer 568, separated by a conductor layer 564. In these FIGS., spin-up electrons are symbolically represented in boxes 57, 57', and spin-down electrons are symbolically represented in boxes 59, 59'. According to the invention, the electron current is passed through the spin filter before it goes into the GMR device. As a result, the proportion of electrons that are spin-up is greater according to the invention, as shown in FIGS. 5B, 5D, than it is without the use of a spin filter, as shown in FIGS. 5A, 5C. When the GMR device is in the anti-parallel state, as shown in FIGS. 5C, 5D, spin-dependent scattering of all the electrons is 100%, or nearly so. When the GMR device is in the parallel state as shown in FIGS. 5A, 5B, spin-dependent scattering of the spin-down electrons is 100%, or nearly so; whereas spin-dependent scattering of the spin-up electrons is zero, or nearly so. The GMR ratio is enhanced according to the invention because the proportion of spin-up electrons in the current entering the GMR device is greater.

Considering the entire spin-dependent scattering in the GMR device to be $\rho\uparrow\uparrow=0$, and $\rho\downarrow\downarrow=\infty$; $R\uparrow\uparrow$ according to the invention is less than $R\uparrow\uparrow$ where no spin-filtering element is employed; and $R\uparrow\downarrow$ according to the invention is less than $R\uparrow\downarrow$ where no spin-filtering element is employed. The GMR ratio is expressed as:

$$GMR = \frac{R\uparrow\downarrow - R\uparrow\uparrow}{R\uparrow\uparrow} \times 100\%.$$

Accordingly, an enhanced GMR ratio is provided according to the invention.

Figure 6A:
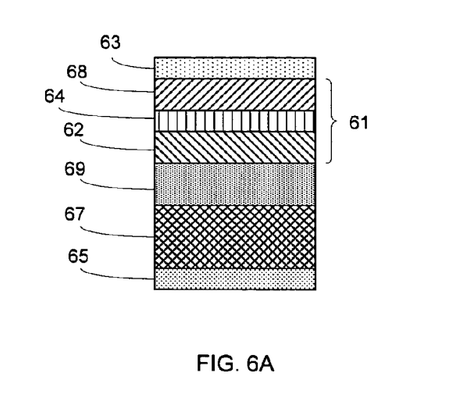
FIGS. 6A, 6B are diagrammatic sketches in sectional view showing the structure of a giant magnetoresistance (pseudo spin-valve structure) device with a spin filtering element according to an aspect of the invention.
Figure 6B:
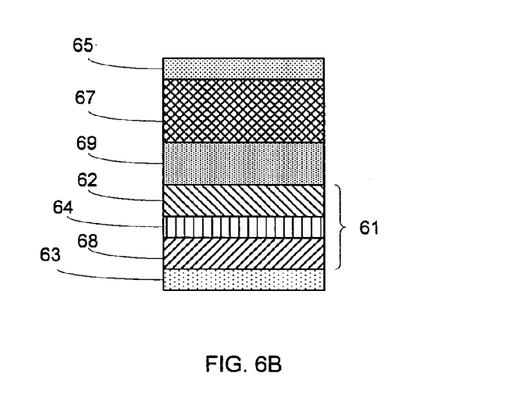

The structures of two alternative embodiments of a GMR or MTJ MRAM cell with a spin filtering element according to an aspect of the invention are shown in a diagrammatic sectional view in FIGS. 6A, 6B. The GMR or MTJ structure 61 includes first and second ferromagnet layers 62, 68, separated by (respectively) conductor or insulator layer 64. A spin-hold layer 69 is adjacent the first ferromagnet layer 62, and the spin filtering element 67 is adjacent the spin-hold layer 69. Metal line 63 is adjacent the second ferromagnet layer 68 of the GMR structure 61; and metal line 65 is adjacent the spin filtering element 67. In FIG. 6A, the spin filtering element is formed before the GMR structure, while in FIG. 6B, the spin filtering element is formed after (over) the GMR or MTJ structure. Where the material of the spin filtering element includes a high temperature processing step, the spin-filtering element is formed before the GMR or MTJ structure, to avoid inter-diffusion with the GMR multilayer or the MTJ during processing. Or, where it is necessary to form a high temperature spin filtering element over a GMR or MTJ structure, a laser anneal may be employed to form the spin filtering element, as described below. On the other hand, where the material of the spin-filtering structure does not include a high temperature processing step, as for example at low temperature or room temperature, the GMR or MTJ may be formed either before or after the spin filtering element.

Figure 7A:
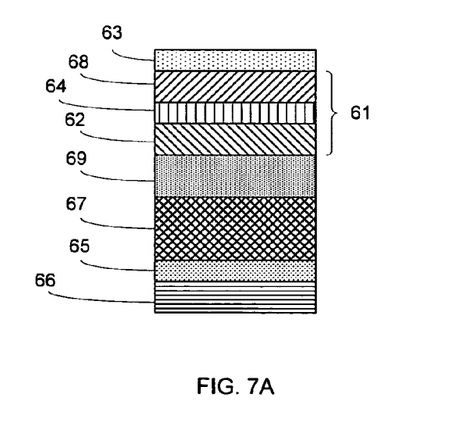
FIGS. 7A, 7B are diagrammatic sketches in sectional view showing the structure of a giant magnetoresistance (spin valve structure) device with a spin filtering element as in FIGS. 6A, 6B, with additional pinning layer according to another aspect of the invention.
Figure 7B:
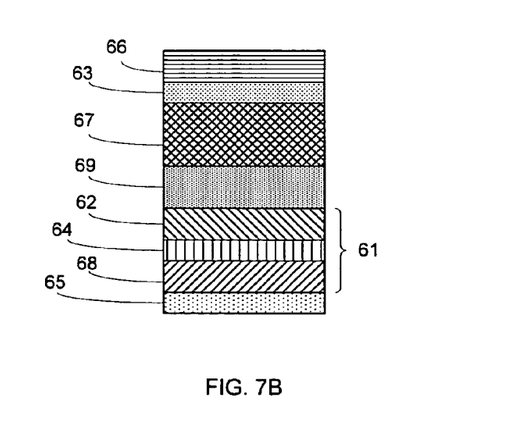

A pinning layer may be formed adjacent the spin filtering element in the GMR or MTJ MRAM cell with a spin filtering element as shown in a diagrammatic sectional view in FIGS. 7A, 7B. The GMR or MTJ structure 61 includes a first and second ferromagnet layers 62, 68, separated by insulator or conductor layer 64. A spin-hold layer 69 is adjacent the first ferromagnet layer 62, and the spin filtering element 67 is adjacent the spin-hold layer 69. Adjacent the spin filtering element 67 is the pinning layer 66, which may be a permanent magnetic material or an antiferromagnetic (AFM) material. In FIG. 7A, the spin filtering element is formed before the GMR or MTJ structure, while in FIG. 7B, the spin filtering element is formed after (over) the GMR or MTJ structure. As noted with reference to FIGS. 6A, 6B, the spin-filtering element must be formed before the GMR or MTJ structure, to avoid inter-diffusion with the multilayer of the GMR or MTJ during processing, if the material of the spin filtering element includes high temperature processing step. Or, where it is necessary to form a high temperature spin filtering element over a GMR or MTJ structure, a laser anneal may be employed to form the spin filtering element, as described below. On the other hand, where the material of the spin-filtering structure does not include a high temperature processing step, as for example at low temperature or room temperature, the GMR or MTJ may be formed either before or after the spin filtering element.

Suitable materials for the GMR or MTJ structure 61 include two ferromagnetic layers separated by a conductor layer (GMR) or by an insulator layer (MTJ). Suitable materials for the ferromagnetic layers include, for example, 3d transition ferromagnetic metals such as, for example, Fe, Co, NiFe, CoFe, FeCoNi; or an alloy (or a Heusler alloy) such as, for example, $Fe_3O_4$, $CrO_2$, $La_xSr_{1-x}MnO_3$, $Pr_xCa_{1-x}MnO_3$. The insulator layer of the MTJ can be formed of, for example, $Al_2O_3$, AlN, AlON, $Ga_2O_3$, $SrTiO_3$ (STO), $HfO_2$, $Ta_2O_5$; and the conductor layer of the GMR can be formed of, for example, Cu, Ag, Au, Ru, Cr. Suitable materials for the spin filtering layer 67 include, for example, an alloy (or a Heusler alloy) such as, for example, $Fe_3O_4$, $CrO_2$, NiMnSb, NiMnGa, $La_xSr_{1-x}MnO_3$, $Pr_xCa_{1-x}MnO_3$. Suitable materials for the spin hold layer 69 include single-crystal or poly-crystal Bi. Suitable materials for the pinning layer 66 include permanent magnetic materials such as, for example, SmCo or SmFeCo; and antiferromagnetic materials such as IrMn, FeMn, or CoFe/Ru/CoFe synthetic antiferromagnetic multilayer or IrMn/CoFe/Ru/CoFe multilayer structures.

Figure 8:
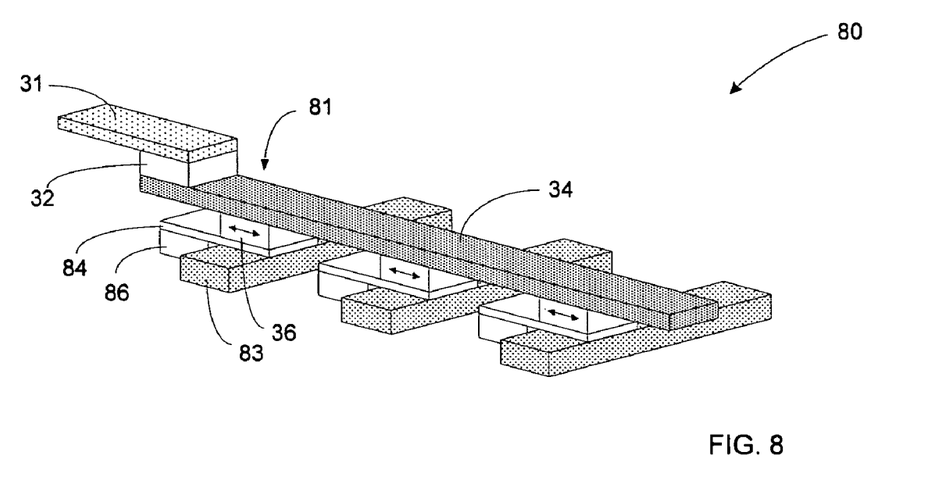
FIG. 8 is a diagrammatic sketch in an orthogonal view showing a portion of a memory array as in FIG. 2 according to an aspect of the invention.

A three-dimensional view of an embodiment of the invention as diagrammed in FIG. 2 and FIG. 3 is shown generally at 80 in FIG. 8. In this illustrative example, a spin filtering element 32 is connected by way of a spin hold wire 34 to a series of three MRAM cells, in one of many parallel rows in the MRAM array. Each MRAM cell 81 includes a MTJ or GMR system 36. A current flows in a metal line 31 to the spin filtering element 32, which filters out most of the spin-down electrons. The filtered electron current flows from the spin filtering element through the spin hold wire 34 to the GMR or MTJ systems 36 in the series. Metal lines 86 connect the MRAM cells 81 to MRAM cells in other series in the MRAM array by the metallic platform 84. Metal lines 83 and 81 support current to produce magnetic field to write to the MRAM cell when the write operation is started. As will be appreciated, the spin hold wire can extend over a large number of MRAM cells in series, and can be provided at intervals with additional spin filtering elements, as shown for example in FIG. 2.

Figure 9:
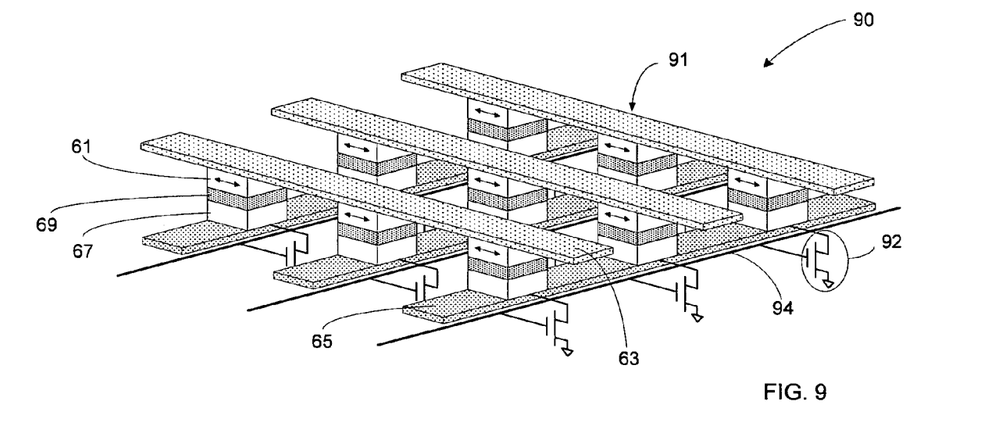
FIG. 9 is a diagrammatic sketch in an orthogonal view showing a portion of a magnetic data storage array as in FIG. 6A according to an aspect of the invention.

A three-dimensional view of an embodiment of the invention as diagrammed in FIG. 6A is shown generally at 90 in FIG. 9. In this illustrative example, a portion (including nine MRAM cells) of an MRAM array are shown. The transistor 92 serves as a selective device of the MRAM array. The metal lines 94 connect the gate of transistor 92 to control the turn-on or turn-off state. A connecting via connects the drain side of the transistor and the bottom layer of the stacked MRAM cell. Each MRAM cell 91 includes a MTJ or GMR system 61. Adjacent each MTJ or GMR system 61 is a spin hold layer 69, and adjacent each spin hold layer 69 is a spin filtering element 67. A current is supplied from the periphery to the selective transistor 92. This current is flowed through contact and via and is introduced into the spin filter 67 of a series of MRAM cells. The spin filtering layers 67 filter out most of the spin-down electrons. In each MRAM cell the filtered electron current flows through the spin hold layer 67 to the MTJ or GMR system 61. Metal lines 63 connect the MRAM cells 61 to MRAM cells in other series in the MRAM array. For a write operation, the metal lines 91 and 65 supply currents to produce a magnetic field on the MRAM cell.

Figure 11A:
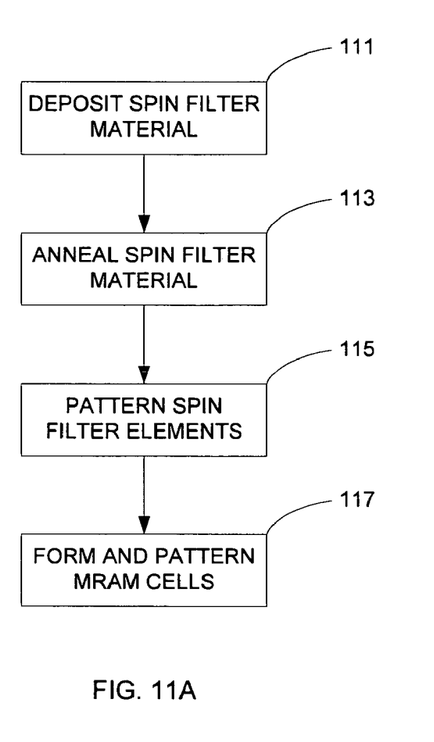
FIGS. 11A, 11B are flow diagrams showing steps in making a MRAM array according to further aspects of the invention.
Figure 11B:
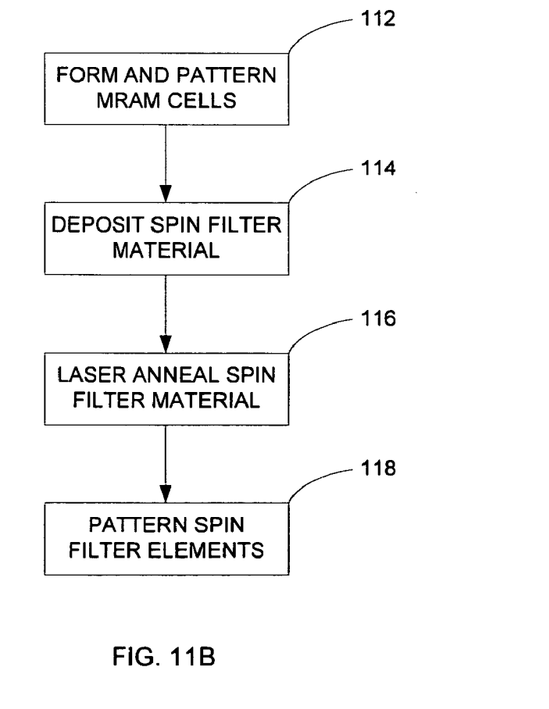

Steps in a process for manufacturing MRAM arrays according to the invention are shown in flow diagrams in FIGS. 11A and 11B.

The spin filter material is formed at a higher temperature than is employed in manufacture of the MRAM cell. In one process, shown in FIG. 1A, the spin filter is formed prior to formation of the MRAM cell. First, the spin filter material is deposited 111 using a deposition technique such as, for example, PVD, IMD, CVD, or MOCVD, and then the deposited material is further annealed 113 by furnace or RTP or by Laser annealing. The anneal temperature and anneal time is selected according to the crystallization point of the material. For example, if LSMO ($La_xSr_{1-x}MnO_3$) is employed as the spin filter material, an anneal is carried out at a temperature in the range about 300° C. to about 450° C. for time in the range about, for example, ½ day. After the annealing process, the material is patterned by photo etch 115. Then the MRAM cell is deposited and patterned 117.

In an alternative process, shown in FIG. 11B, the MRAM cell is formed prior to formation of the spin filter and, because the thermal stability of MRAM cell is weaker than that of the spin filter material, the temperature treatment of spin filter element must be carefully controlled to limit damage to the MRAM cell. Laser annealing is particularly suitable in this situation, because it provides very rapid thermal ramp-up and down. After the MRAM cell is formed and patterned 112, the spin filter material is deposited 114. Then the laser anneal is performed to anneal the spin filter material only 116. The annealed spin filter element is then patterned by photo etch 118.

Figure 10:
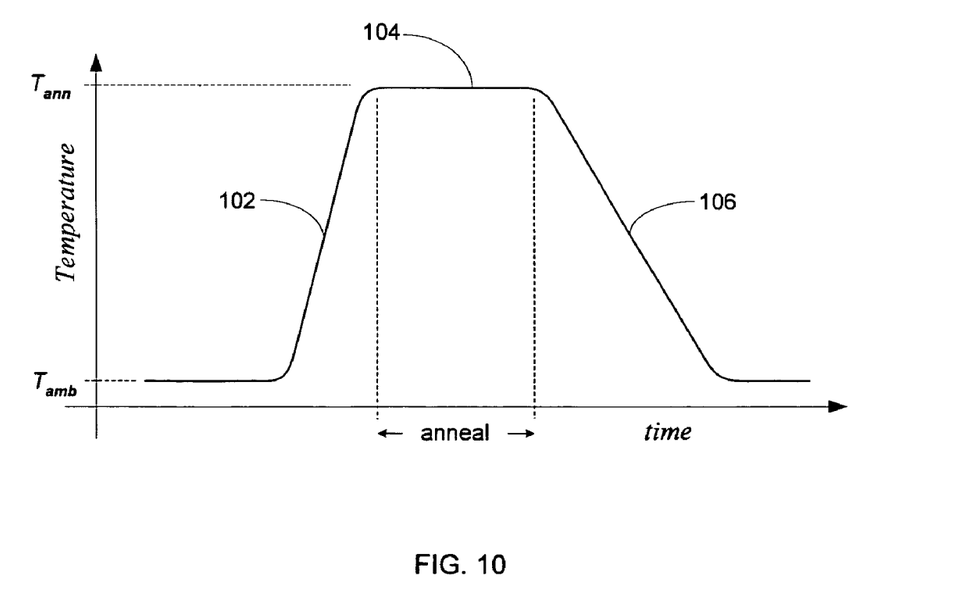
FIG. 10 is a temperature-time plot illustrating a temperature regime during part of a process for forming a spin filtering element according to an aspect of the invention.

A generalized temperature regime for the laser anneal, rapid thermal anneal (RTA), or furnace anneal step in forming the spin filtering element is shown graphically in FIG. 10. Laser energy pulses are fired onto the deposited spin filtering material, to ramp the temperature rapidly up, as shown at 102, from ambient ($T_{amb}$), which may be about room temperature, to an annealing temperature 104 ($T_{ann}$). The laser firing is maintained for a time sufficient to effect the anneal, and then the laser is shut off, to allow the temperature to fall, as shown at 106, back to ambient. As will be appreciated, the pulse rate and pulse duration, and the energy fluency, will be selected to provide rapid localized heating of the spin filtering material to the required anneal temperature, without raising adjacent regions to temperatures that would cause damage to nearby features (particularly, the MTJ or GMR) that have already been formed. The RTA and furnace anneal processes have a similar temperature regime, as shown in FIG. 10. The time scale for the RTA process is in the order of several seconds, and the time scale for the furnace anneal is in the order of several minutes to several hours. The time scale for the laser anneal is in the order of several μseconds.

Annealing temperature and anneal time are selected according to the melting point and the crystallization behavior of the particular material. Generally a suitable annealing temperature is given by (Tm+273)/2, where Tm is the melting point of the material in degrees Centigrade. Such an annealing temperature can result in formation of a single crystal. It may not be necessary, however, to obtain a single crystal; accordingly, a denominator greater than 2 (for example, 3) can be used to determine an anneal temperature in a particular instance. For example, in a furnace anneal process, a satisfactory texture can be obtained in NiMnGa by annealing at 800° C. for an extended time (as long as 1 day, for example).

On the other hand, damage to an MTJ material can result at a temperature as little as 400° C., and damage to a GMR material can result at a temperature as little as 300° C., and so it is important that parameters of the laser (e.g., wavelength, energy) be set so that adjacent features are not excessively heated. By way of example of a laser anneal process carried out following formation of the MTJ or GMR, a KrF excimer laser employed at 120 mJ can raise the temperature sufficiently to heat and anneal the spin filter material. Suitable shot durations may be in the order of about several μsec. The energy can be delivered at a rate about, for example, 10 Hz, to protect the prior MTJ or GMR material from damage by heat.

Other embodiments are within the following claims.

What is claimed is:

1. A MRAM construct, comprising a MRAM cell structure connected by a spin hold element to a spin filtering element.

2. The MRAM construct of claim 1 wherein the MRAM cell structure comprises a GMR device.

3. The MRAM construct of claim 1 wherein the MRAM cell structure comprises a MTJ device.

4. The MRAM construct of claim 2 wherein the MRAM cell structure comprises at least two ferromagnetic layers separated by a conductor layer.

5. The MRAM construct of claim 3 wherein the MRAM cell structure comprises at least two ferromagnetic layers separated by an insulator layer.

6. The MRAM construct according to claim 1 wherein the spin filtering element includes a ferromagnetic material having a high magnetic polarization value.

7. The MRAM construct according to claim 1 wherein the spin filtering element includes a Heusler alloy.

8. The MRAM construct according to claim 7 wherein the Heusler alloy is a Mn based Heusler alloy.

9. The MRAM construct according to claim 1 wherein the spin filtering element includes a Mn based Heusler alloy selected from the group consisting of NiMnSb and NiMnGa.

10. The MRAM construct according to claim 7 wherein the Heusler alloy is an oxide based Heusler alloy.

11. The MRAM construct according to claim 1 wherein the spin filtering element includes an oxide based alloy selected from the group consisting of $Fe_3O_4$ and $CrO_2$.

12. The MRAM construct according to claim 1 wherein the spin filtering element includes a Mn based CMR material.

13. The MRAM construct according to claim 12 wherein the spin filtering element includes a Mn based CMR material selected from the group consisting of $La_xSr_{1-x}MnO_3$ and $Pr_xCa_{1-x}MnO_3$.

14. The MRAM construct according to claim 1 wherein the spin filtering element includes a Mn based ferromagnetic material.

15. The MRAM construct according to claim 14 wherein the Mn based ferromagnetic material of the spin filtering element comprises NiMnGa.

16. The MRAM construct according to claim 14 wherein the Mn based ferromagnetic material of the spin filtering element comprises NiMnSb.

17. The MRAM construct according to claim 1 wherein the spin filtering element includes an oxide based ferromagnetic material.

18. The MRAM construct according to claim 17 wherein the oxide based ferromagnetic material of the spin filtering element comprises $Fe_3O_4$.

19. The MRAM construct according to claim 17 wherein the oxide based ferromagnetic material of the spin filtering element comprises $CrO_2$.

20. The MRAM construct according to claim 1 wherein the spin hold element comprises a material having a high spin diffusion length.

21. The MRAM construct according to claim 20 wherein the spin hold element comprises a material having a spin diffusion length at least about 100 nm.

22. The MRAM construct according to claim 1 wherein the spin hold element comprises Bi.

23. The MRAM construct according to claim 22 wherein the spin hold element comprises single-crystal Bi.

24. The MRAM construct according to claim 22 wherein the spin hold element comprises poly-crystal Bi.

25. The MRAM construct according to claim 1 wherein the spin hold element and the spin filtering element are adjacent layers in the MRAM cell structure, and the spin hold element comprises a conductive metal layer having a thickness less than the electron mean free path in the metal.

26. The MRAM construct of claim 25 wherein the metal of the spin hold conductive metal layer is Cu.

27. The MRAM construct of claim 26 wherein the spin hold Cu layer has a thickness in the range about 4 nm to about 10 nm.

28. The MRAM construct of claim 25 wherein the metal of the spin hold conductive metal layer is Al.

29. The MRAM construct of claim 28 wherein the spin hold Al layer has a thickness in the range about 4 nm to about 5 nm.

30. The MRAM construct according to claim 1 wherein the MRAM cell structure comprises a MTJ system having first and second ferromagnet layers separated by a thin insulator, the ferromagnet layers having different coercivity fields.

31. The MRAM construct according to claim 30 wherein the insulator comprises a material selected from the group consisting of $Al_2O_3$, AlN, AlON, $Ga_2O_3$, $SrTiO_3$, $HFO_2$, $Ta_2O_5$.

32. The MRAM construct according to claim 30 wherein the first ferromagnet layer comprises a material different from that of the second ferromagnet layer.

33. The MRAM construct according to claim 30 wherein the first ferromagnet layer and the second ferromagnet layer each comprise a material selected from the group consisting of a 3d transition ferromagnet material.

34. The MRAM construct of claim 33 wherein the 3d transition ferromagnetic material is selected form the group consisting of Fe, Co, CoFe and CoFeNi.

35. The MRAM construct of claim 30 wherein the first ferromagnet layer and the second ferromagnet layer each comprise a Heusler alloy.

36. The MRAM construct of claim 35 wherein the Heusler alloy comprises a material selected from the group consisting of $La_xSr_{1-x}MnO_3$ and $Pr_xCa_{1-x}MnO_3$.

37. The MRAM construct of claim 30 wherein the first ferromagnet layer and the second ferromagnet layer each comprise an oxide based alloy.

38. The MRAM construct of claim 37 wherein the oxide based alloy is selected from the group consisting of $Fe_3O_4$ and $CrO_2$.

39. The MRAM construct according to claim 1 wherein the MRAM cell structure comprises a GMR system having first and second ferromagnet layers separated by a thin conductor, the ferromagnet layers having different coercivity fields.

40. The MRAM construct according to claim 39 wherein the conductor comprises a material selected from the group consisting of Cu, Ag, Au, Ru, Cr.

41. The MRAM construct according to claim 39 wherein the first ferromagnet layer comprises a material different from that of the second ferromagnet layer.

42. The MRAM construct according to claim 39 wherein the first ferromagnet layer and the second ferromagnet layer each comprise a material selected from the group consisting of a 3d transition ferromagnet material.

43. The MRAM construct of claim 42 wherein the 3d transition ferromagnetic material is selected form the group consisting of Fe, Co, CoFe and CoFeNi.

44. The MRAM construct of claim 39 wherein the first ferromagnet layer and the second ferromagnet layer each comprise a Heusler alloy.

45. The MRAM construct of claim 43 wherein the Heusler alloy comprises a material selected from the group consisting of $La_xSr_{1-x}MnO_3$ and $Pr_xCa_{1-x}MnO_3$.

46. The MRAM construct of claim 39 wherein the first ferromagnet layer and the second ferromagnet layer each comprise an oxide based alloy.

47. The MRAM construct of claim 46 wherein the oxide based alloy is selected from the group consisting of $Fe_3O_4$ and $CrO_2$.

48. The MRAM construct according to claim 30 wherein the MRAM cell structure comprises a spin-valve MTJ.

49. The MRAM construct according to claim 32 wherein the spin-valve MTJ comprises a free ferromagnetic layer and a pinned ferromagnetic layer and a pinning layer.

50. The MRAM construct according to claim 49 wherein the pinning layer comprises an antiferromagnetic material.

51. The MRAM construct according to claim 49 wherein the pinning layer comprises a Mn based material.

52. The MRAM construct according to claim 51 wherein the Mn based material is selected from the group consisting of IrMn and FeMn.

53. The MRAM construct according to claim 49 wherein the pinning layer comprises a synthetic antiferromagnetic multilayer.

54. The MRAM construct according to claim 53 wherein the synthetic antiferromagnetic multilayer comprises layers selected from the group consisting of CoFe/Ru/CoFe and Co/Ru/Co.

55. The MRAM construct according to claim 49 wherein the pinning layer comprises a mixed multilayer comprising a synthetic antiferromagnetic material and an antiferromagnetic material.

56. The MRAM construct according to claim 55 wherein the mixed multilayer comprises layers selected from the group consisting of IrMn/CoFe/Ru/CoFe and FeMn/Co/Ru/Co.

57. The MRAM construct according to claim 49 wherein the pinning layer comprises a permanent magnet material.

58. The MRAM construct according to claim 49 wherein the permanent magnet material is selected from the group consisting of SmCo and SmFeCo.

59. The MRAM construct according to claim 30 wherein the MRAM cell structure comprises a pseudo-spin valve MTJ.

60. The MRAM construct according to claim 59 wherein the MRAM cell structure comprises a soft ferromagnetic layer and a hard ferromagnetic layer, wherein the coercivity of the hard ferromagnetic layer is greater than the coercivity of the soft ferromagnetic layer.

61. The MRAM construct of claim 60 wherein the soft ferromagnetic layer comprises a material selected from the group consisting of NiFe, Co and NiFeCo.

62. The MRAM construct of claim 60 wherein the hard ferromagnetic layer comprises a material selected from the group consisting of CoFe and Co.

63. The MRAM construct of claim 30 wherein the MRAM cell structure comprises a MTJ comprising a granular material.

64. The MRAM construct of claim 63 wherein the distance between grains of ferromagnetic material is in a range about 100 Å to about 300 Å.

65. The MRAM structure of claim 63 wherein the granular material is selected from the group consisting of $Fe-Al_2O_3$, $Fe-SiO_2$, $Co-SiO_2$.

66. The MRAM construct according to claim 39 wherein the MRAM cell structure comprises a spin-valve GMR.

67. The MRAM construct according to claim 66 wherein the spin-valve GMR comprises a free ferromagnetic layer and a pinned ferromagnetic layer and a pinning layer.

68. The MRAM construct according to claim 67 wherein the pinning layer comprises an antiferromagnetic material.

69. The MRAM construct according to claim 67 wherein the pinning layer comprises a Mn based material.

70. The MRAM construct according to claim 69 wherein the Mn based material is selected from the group consisting of IrMn and FeMn.

71. The MRAM construct according to claim 67 wherein the pinning layer comprises a synthetic antiferromagnetic multilayer.

72. The MRAM construct according to claim 71 wherein the synthetic antiferromagnetic multilayer comprises layers selected from the group consisting of CoFe/Ru/CoFe and Co/Ru/Co.

73. The MRAM construct according to claim 67 wherein the pinning layer comprises a mixed multilayer comprising synthetic antiferromagnetic material and an antiferromagnetic material.

74. The MRAM construct according to claim 73 wherein the mixed multilayer comprises layers selected from the group consisting of IrMn/CoFe/Ru/CoFe and FeMn/Co/Ru/Co.

75. The MRAM construct according to claim 67 wherein the pinning layer comprises a permanent magnet material.

76. The MRAM construct according to claim 67 wherein the permanent magnet material is selected from the group consisting of SmCo and SmEeCo.

77. The MRAM construct of claim 39 wherein the MRAM cell structure comprises a pseudo-spin valve GMR.

78. The MRAM construct according to claim 77 wherein the MRAM cell structure comprises a soft ferromagnetic layer and a hard ferromagnetic layer, wherein the coercivity of the hard ferromagnetic layer is greater than the coercivity of the soft ferromagnetic material.

79. The MRAM construct of claim 78 wherein the soft ferromagnetic layer comprises a material selected from the group consisting of NiFe, Co and NiFeCo.

80. The MRAM construct of claim 78 wherein the hard ferromagnetic layer comprises a material selected from the group consisting of CoFe and Co.

81. The MRAM construct of claim 39 wherein the MRAM cell structure comprises a GMR comprising a granular material.

82. The MRAM construct of claim 81 wherein the distance between grains of ferromagnetic material is in a range about 100 Å to about 300 Å.

83. The MRAM structure of claim 81 wherein the granular material is selected from the group consisting of $Fe-Al_2O_3$, $Fe-SiO_2$, $Co-SiO_2$.

84. The MRAM structure of claim 39 wherein the GRM system comprises a periodic multilayer structure, alternating a ferromagnetic material with a nonferromagnetic material.

85. The MRAM structure of claim 84 wherein the multilayer structure comprises $(NiFe/Cu)_n$.

86. A MRAM array comprising the MRAM construct of claim 1.

87. An MRAM construct comprising a plurality of MRAM cell structures, and including a spin filtering element connected to the plurality of MRAM cell structures by a spin hold wire adjacent a first ferromagnetic layer on the MRAM cell structures.

88. The MRAM construct of claim 87 wherein the spin hold wire comprises Bi.

89. An MRAM construct comprising a plurality of MRAM cells, each MRAM cell comprising a MRAM cell structure, a spin hold layer adjacent the MRAM cell structure, and a spin filtering layer adjacent the spin hold layer.

90. The MRAM construct of claim 89 wherein the spin hold layer comprises Bi.

91. The MRAM construct of claim 89 wherein the spin hold layer comprises a layer of a conductive metal, the layer having a thickness less than the electron mean free path in the metal.

92. The MRAM construct of claim 91 wherein the conductive metal layer comprises Cu.

93. The MRAM construct of claim 92 wherein the Cu layer has a thickness in the range about 4 nm to about 10 nm.

94. The MRAM construct of claim 91 wherein the layer comprises Al.

95. The MRAM construct of claim 94 wherein the Al layer has a thickness in the range about 4 nm to about 5 nm.

* * * * *

UNITED STATES PATENT AND TRADEMARK OFFICE
CERTIFICATE OF CORRECTION

PATENT NO. : 7,323,732 B2  Page 1 of 1
APPLICATION NO. : 10/791911
DATED : January 29, 2008
INVENTOR(S) : ChiaHua Ho and Hsiang-Lan Lung It is certified that error appears in the above-identified patent and that said Letters Patent is hereby corrected as shown below:

Column 11, line 46, delete "form" and insert -- from --.

Column 12, line 9, delete "form" and insert -- from --.

Column 13, line 44, delete "SmEeCo" and insert -- SmFeCo --.

Signed and Sealed this

Sixth Day of May, 2008

JON W. DUDAS
*Director of the United States Patent and Trademark Office*